(12) United States Patent
Amoah et al.

(10) Patent No.: US 9,136,222 B2
(45) Date of Patent: Sep. 15, 2015

(54) CHIP IDENTIFICATION PATTERN AND METHOD OF FORMING

(75) Inventors: Yoba Amoah, Fairfax, VT (US); John J. Ellis-Monaghan, Grand Isle, VT (US); Roger C. Kuo, South Burlington, VT (US); Molly J. Leitch, Nashville, TN (US); Zhihong Zhang, Chandler, AZ (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 332 days.

(21) Appl. No.: 13/469,386

(22) Filed: May 11, 2012

(65) Prior Publication Data

US 2013/0299939 A1    Nov. 14, 2013

(51) Int. Cl.
*H01L 21/312*    (2006.01)
*H01L 23/544*    (2006.01)
*H01L 27/08*    (2006.01)

(52) U.S. Cl.
CPC .............. *H01L 23/544* (2013.01); *H01L 27/08* (2013.01); *H01L 2223/5444* (2013.01); *H01L 2223/5446* (2013.01); *H01L 2223/54473* (2013.01)

(58) Field of Classification Search
USPC ................................................ 430/394, 319
See application file for complete search history.

(56) References Cited

U.S. PATENT DOCUMENTS

| | | |
|---|---|---|
| 5,175,774 A | 12/1992 | Truax et al. |
| 5,294,812 A | 3/1994 | Hashimoto et al. |
| 5,763,057 A | 6/1998 | Sawada et al. |
| 6,331,709 B1 | 12/2001 | Amemiya et al. |
| 6,869,819 B2 | 3/2005 | Watanabe et al. |
| 7,316,934 B2 | 1/2008 | Mangell |
| 7,440,860 B2 | 10/2008 | Raitter |
| 7,558,969 B1 | 7/2009 | Lucero et al. |
| 7,603,637 B2 | 10/2009 | Haehn |
| 7,732,263 B2 | 6/2010 | Yamazaki et al. |
| 7,783,887 B2 | 8/2010 | Lewis et al. |
| 2004/0199892 A1* | 10/2004 | Igarashi et al. ................. 716/12 |
| 2009/0094566 A1 | 4/2009 | Bueti et al. |
| 2010/0164603 A1 | 7/2010 | Hafez et al. |
| 2010/0321049 A1 | 12/2010 | Fornara et al. |

FOREIGN PATENT DOCUMENTS

EP    0434141 A1    6/1991

* cited by examiner

*Primary Examiner* — Daborah Chacko Davis
(74) *Attorney, Agent, or Firm* — Michael Lestrange; Hoffman Warnick LLC

(57) ABSTRACT

Various embodiments disclosed include methods of performing a double exposure process on a level of an integrated circuit (IC) chip to form an IC chip having an embedded electrically measurable identifier. In some cases, the method includes: exposing a level of an integrated circuit (IC) chip using a first mask orientation; subsequently exposing the level of the IC chip using a second mask orientation distinct from the first mask orientation; and developing the level of the IC chip to form an electrically measurable identifier on the IC chip.

8 Claims, 20 Drawing Sheets

CHIP IDENTIFICATION PATTERN AND METHOD OF FORMING

FIELD OF THE INVENTION

The subject matter disclosed herein relates to integrated circuit chips. More specifically, the subject matter disclosed herein relates to patterning of integrated circuit chips.

BACKGROUND

Integrated circuit (IC) chip identification is conventionally performed by either optical recognition or triggering (blowing) an electrical fuse. These approaches can be expensive and time consuming. Additionally, these approaches require test structures which occupy valuable real estate on a wafer holding the IC chip(s). Even further, blowing electrical fuses can cause chip defects which reduce reliability and yield.

BRIEF SUMMARY

Various embodiments disclosed include methods of performing a double exposure process on a level of an integrated circuit (IC) chip to form an IC chip having an embedded electrically measurable identifier. In some cases, the method includes: exposing a level of an integrated circuit (IC) chip using a first mask orientation; subsequently exposing the level of the IC chip using a second mask orientation distinct from the first mask orientation; and developing the level of the IC chip to form an electrically measurable identifier on the IC chip.

A first aspect of the invention includes a method including performing a double exposure process on a level of an integrated circuit (IC) chip to form an electrically measurable identifier on the IC chip.

A second aspect of the invention includes a method including: exposing a level of an integrated circuit (IC) chip using a first mask orientation; subsequently exposing the level of the IC chip using a second mask orientation distinct from the first mask orientation; and developing the level of the IC chip to form an electrically measurable identifier on the IC chip.

A third aspect of the invention includes an integrated circuit (IC) structure having an embedded electrically measurable identifier being measurable for at least one of electrical continuity, electrical resistance or electrical capacitance.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
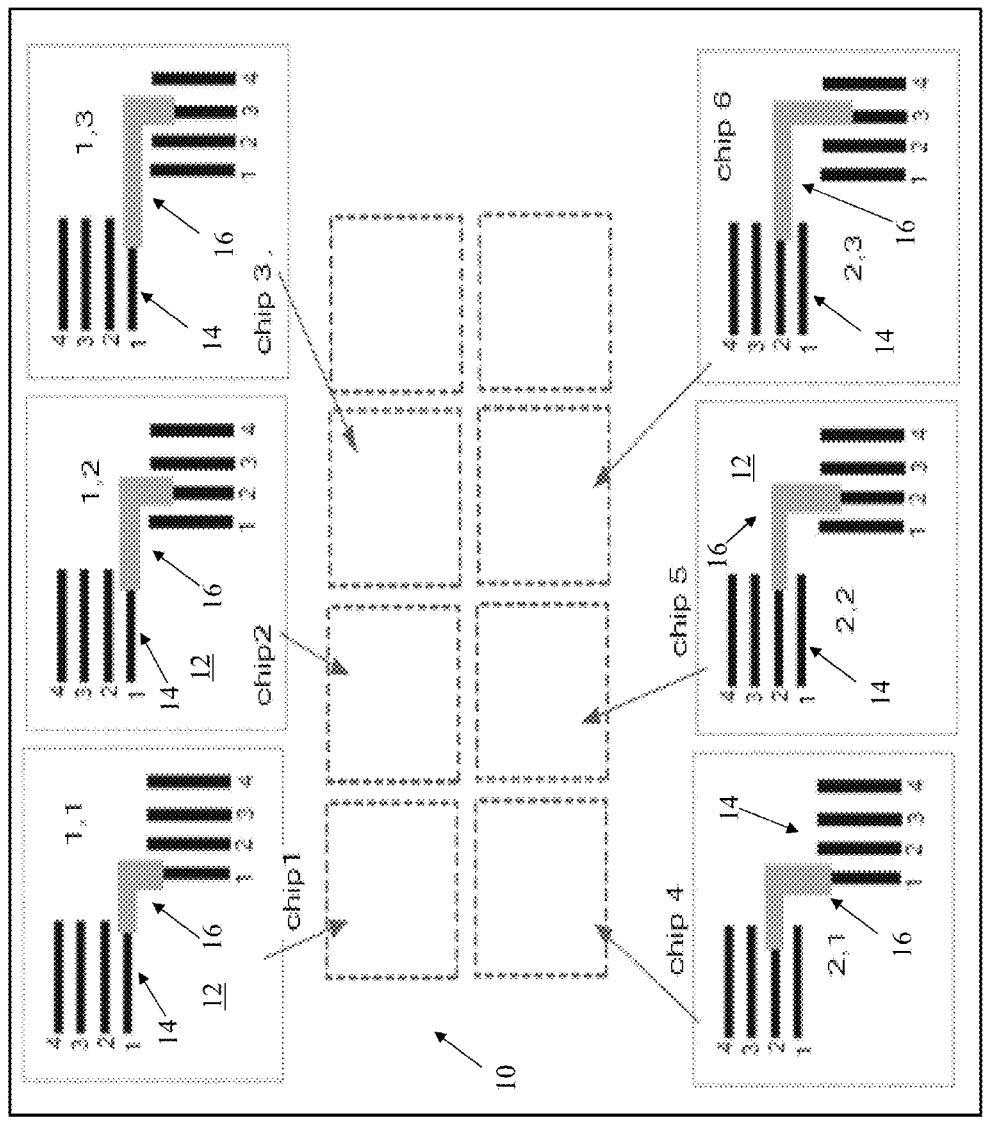
FIG. 1 depicts a schematic view of a portion of a wafer layout having a plurality of integrated circuit (IC) chips according to various embodiments.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As noted herein, the subject matter disclosed relates to integrated circuit chips. More specifically, the subject matter disclosed herein relates to patterning of integrated circuit chips to form identifiers on those chips.

As described herein, integrated circuit (IC) chip identification is conventionally performed by either optical recognition or triggering (blowing) an electrical fuse. These approaches can be expensive and time consuming. Additionally, these approaches require test structures which occupy valuable real estate on a wafer holding the IC chip(s). Even further, blowing electrical fuses can cause chip defects which reduce reliability and yield.

In contrast to these prior approaches, various embodiments of the invention include double-patterning an integrated circuit (IC) chip with an electrical identifying feature. In some cases, at the metal formation level of an IC chip on a wafer or kerf, the chip or the kerf is double-exposed to create a distinct pattern on or proximate to each chip. The unique pattern can serve as an identifier for the chip without the need for electrical or laser-based fuse triggering. The use of a double-patterned identifier can reduce the time used to probe the IC chip(s) on the wafer as compared to the electrical or laser-based fuse approaches. Additionally, using a double-patterned identifier can avoid creating defects in the IC chips which are present in the electrical or laser-based fuse approaches (e.g., from blowing fuses).

Various embodiments include a method including performing a double exposure process on a level of an integrated circuit (IC) chip to form an electrically measurable identifier on the IC chip. In various specific embodiments, the method can include performing a double exposure process on a single level of an IC chip to form the electrically measureable identifier on the IC chip. In other embodiments, the method can include performing a double exposure process on a plurality of levels of the IC chip to form an electrically measureable identifier spanning the plurality of levels of the IC chip.

Various other embodiments include a method including: exposing a level of an integrated circuit (IC) chip using a first mask orientation; subsequently exposing the level of the IC chip using a second mask orientation distinct from the first mask orientation; and developing the level of the IC chip to form an electrically measurable identifier on the IC chip.

Various additional embodiments include an integrated circuit (IC) structure having an embedded electrically measurable identifier being measurable for at least one of electrical continuity, electrical resistance or electrical capacitance.

Turning to FIG. 1, a schematic view of a portion of a wafer layout 10 (including chips 1-6) having a plurality of integrated circuit (IC) chips 12 (chip 1 through chip 6) is shown according to various embodiments. As shown, in various embodiments, each chip 12 is formed in part using a first mask 14 and a second mask 16 (some labeling omitted for clarity of illustration). The orientation of the first mask 14 and the second mask 16 can be used to uniquely expose a region distinct to each chip 12 (e.g., distinct exposure for each of chips 1-6).

Figure 2:
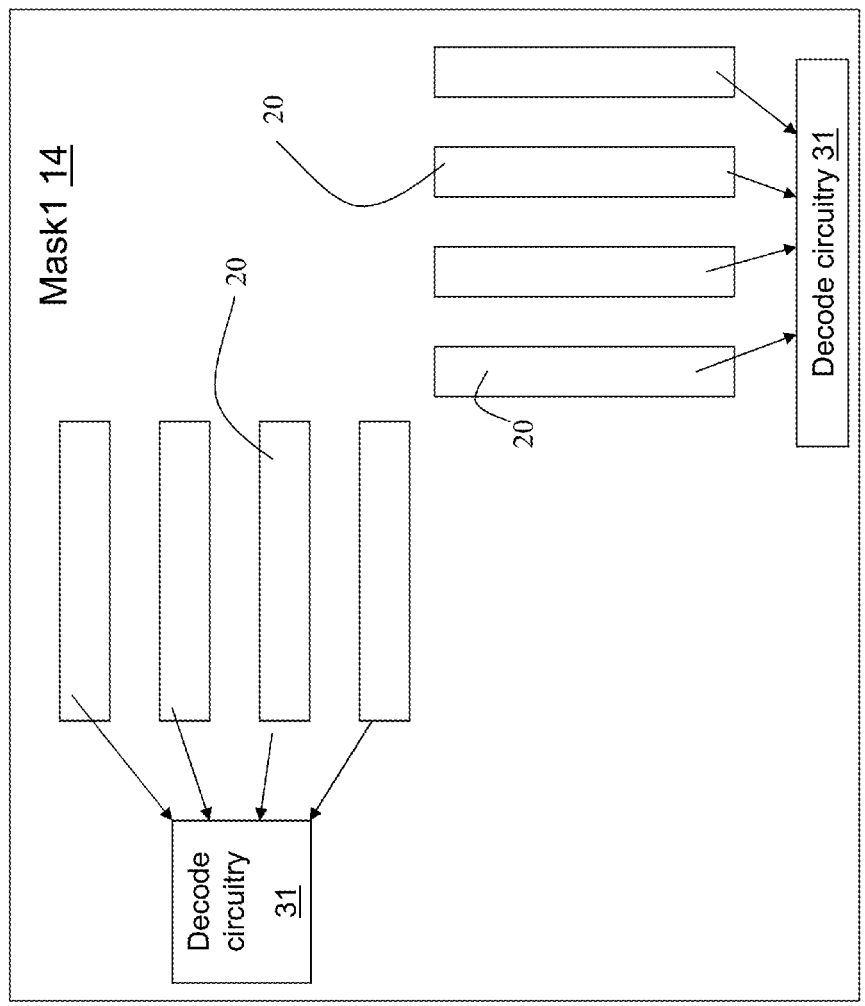
FIG. 2 depicts a schematic view of a mask layout according to various embodiments of the invention.

FIG. 2 shows a close-up view of the first mask 14 from FIG. 1, which can include a plurality of mask shapes 20, e.g., aligned perpendicularly to form sets of perpendicular lines. In some cases, the mask shapes 20 are oriented to form sets of perpendicular lines for connecting with decode circuitry 31.

Figure 3:
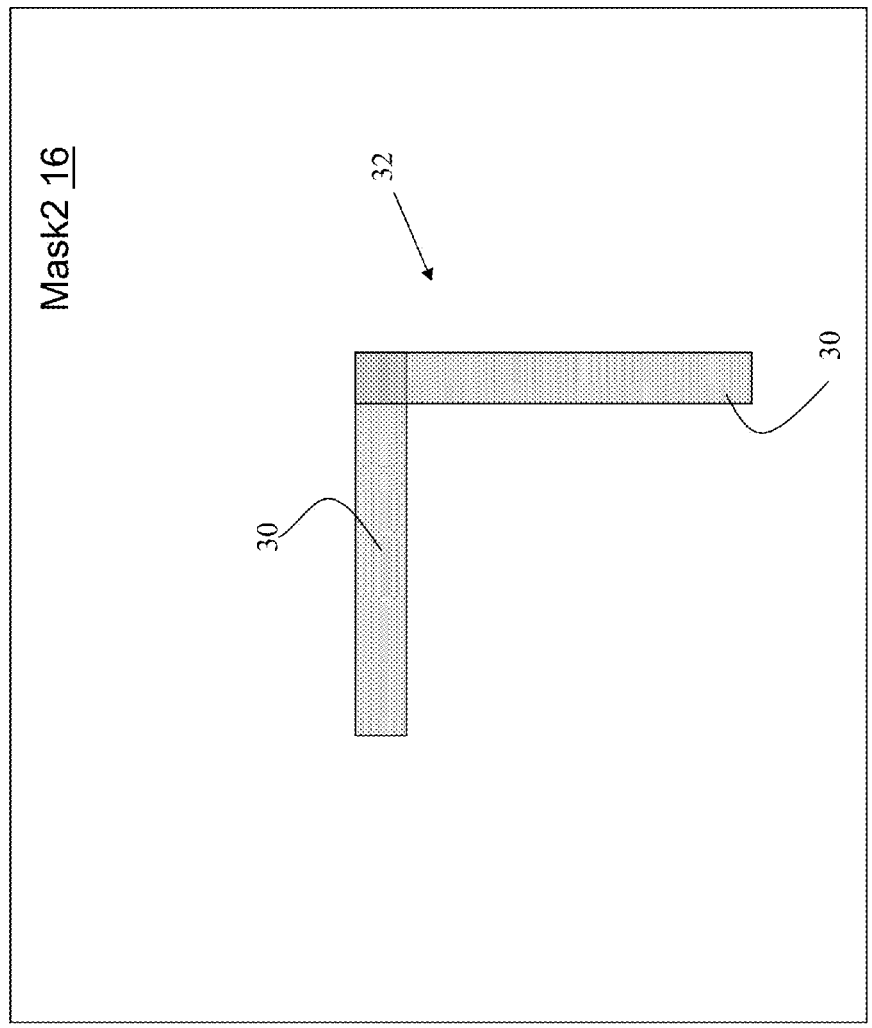
FIG. 3 depicts a schematic view of a second mask layout according to various embodiments of the invention.

FIG. 3 shows a close-up view of the second mask 16 from FIG. 1, which can include a plurality of mask shapes 30, e.g., aligned perpendicularly to form a connecting mask structure 32. The connecting mask structure 32 is configured to form an "L-shaped" connecting structure which connects two distinct perpendicular lines from the sets of perpendicular lines discussed with reference to FIG. 2.

Figure 4:
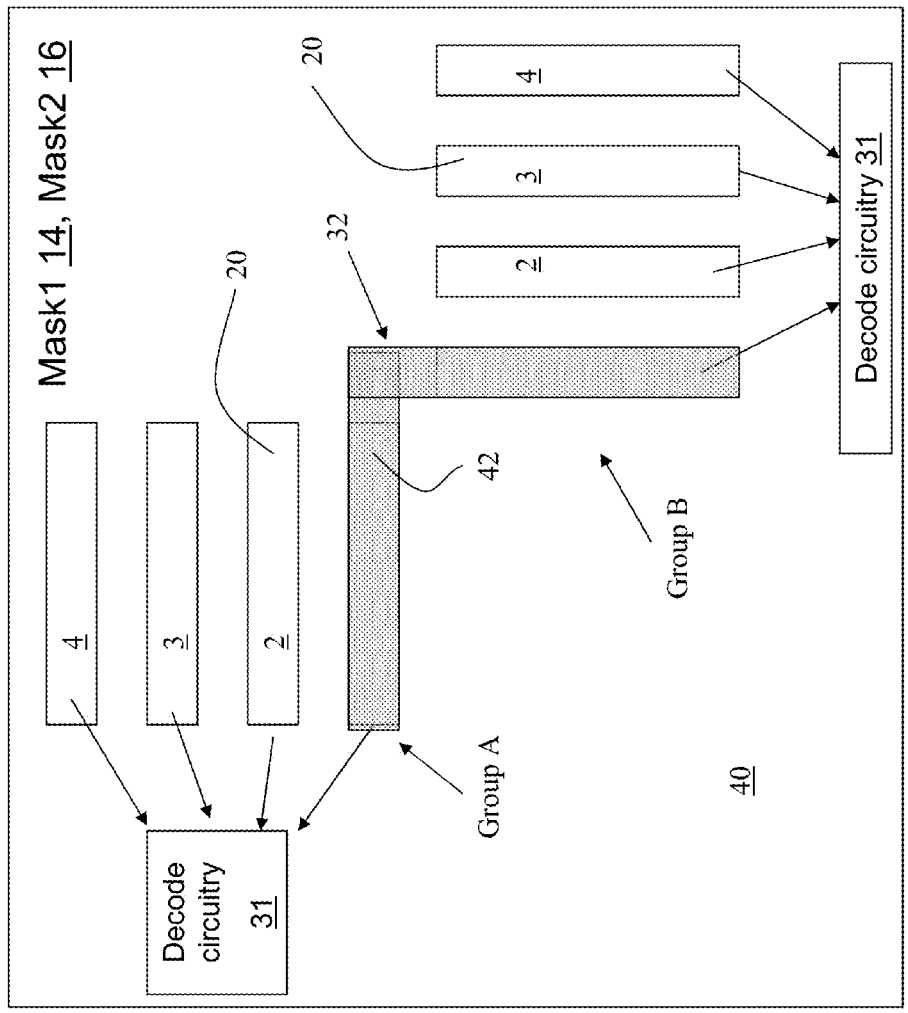
FIG. 4 depicts a schematic view of the mask layout of FIG. 3 overlying the mask layout of FIG. 2 according to various embodiments of the invention.

FIG. 4 shows a close-up overlay of the first mask 14 and the second mask 16 on a first IC chip (e.g., chip 1 from FIG. 1), which forms a unique connection between the first line (line 1) of the group A lines and the first line (line 1) of the group B lines. As shown, exposing the first mask 14 and the second mask 16 on the same layer 40 of the IC chip 12 forms a unique identifier 42, which includes a connection between line 1 of Group B and line 1 of Group A. The unique identifier 42 is electrically measurable, e.g., it is formed of a conductive material which can be probed by one or more conventional electrical probes. The unique identifier 42 can include an electrically measurable identifier, which is measurable for at least one of electrical continuity, electrical resistance or electrical capacitance. That is, given a known length of the unique identifier 42 and its circuitry connections, the identifier 42 can be tested for an expected electrical continuity, resistance or capacitance. As described herein, various embodiments include forming electrically measurable identifiers 42 on each of a plurality of IC chips 12 (e.g., IC chips 1-6 in FIG. 1) such that each IC chip 12 includes an electrically measurable identifier 42 unique to that IC chip 12.

Figure 5:
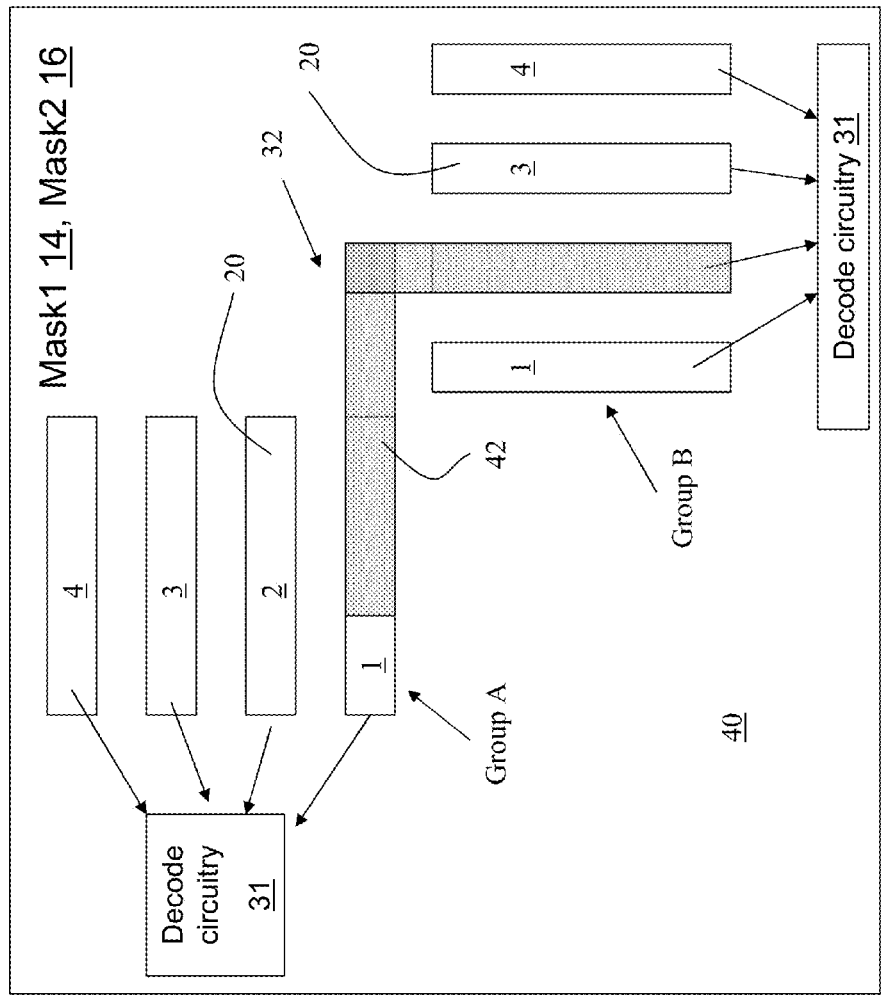
FIG. 5 depicts a schematic view of the mask layout of FIG. 3 overlying the mask layout of FIG. 2 according to various embodiments of the invention.

FIG. 5 shows a close-up overlay of the first mask 14 and the second mask 16 on a second IC chip (e.g., chip 2 from FIG. 1), which forms a unique connection between the first line (line 1) of the group A lines and the second line (line 2) of the group B lines. It is understood that in some embodiments, distinct sets of masks (e.g., distinct from first mask 14 and second mask 16) can be used to form a unique identifier 42 on the second IC chip (e.g., chip 2), which includes an electrically measurable identifier of that second IC chip. As shown, the second mask 16 is shifted when compared with the overlay of FIG. 4, such that a unique identifier 42 is formed in the connection between line 1 of the Group A lines and line 2 of the Group B lines.

Further illustrations of the overlay combinations are omitted to avoid redundancy. However, it is understood that the second mask 16 can be shifted such that any lines from Group A can connect with lines in Group B, e.g.: line 1 (Group A) connects with line 3 (Group B); line 3 (Group A) connects with line 2 (Group B); line 2 (Group A) connects with line 4 (Group B), etc. It is understood that a unique identifier 42 can be formed on each of a plurality of IC chips on a wafer, as illustrated generally in FIG. 1. In various embodiments, these unique identifiers 42 are electrically testable to provide information about the chip on which they are formed.

In the examples shown in FIGS. 4-5, it is understood that various methods can include using a single mask, printed a plurality of times, to form each of these structures. That is, the method can include the following process:

P1: Overlay a first mask (e.g., first mask 14) on the level of the chip, and print (e.g., deposit mask material to form a pattern). This embodiment can include printing a mask which only includes the lines illustrated in one of the groups (e.g., Group A), and then rotating that mask and subsequently printing to form the lines illustrated in a second group (e.g., Group B).

P2: Overlay a second mask (e.g., second mask 16) on the same level of the chip, so as to connect a single line from a first group (e.g., Group A) to a single line from a second group (e.g., Group B), and print. It is understood that this second mask (e.g., second mask 16) can form a diode on the chip, where the diode connects a line from Group A with the line from Group B.

P3 (optional): Overlay first mask, second mask, or another mask distinct from the first mask and the second mask, on a level of another chip on the wafer, and print. This process can include repeating processes P1-P2 for a plurality of chips on a wafer. In some cases, as described herein, these processes can be performed on all chips on a wafer, such that each of the chips on that wafer includes a unique, electrically measurable identifier.

Process P4: Develop the wafer (including the level of each of the plurality of chips), e.g., by exposing the wafer to a light source through the overlying first mask 14 and second mask 16. This causes the designated pattern to be formed within the underlying level of each of the plurality of chips. Subsequently, the designated pattern(s) can be filled with a conductive material such as a metal.

Figure 6:
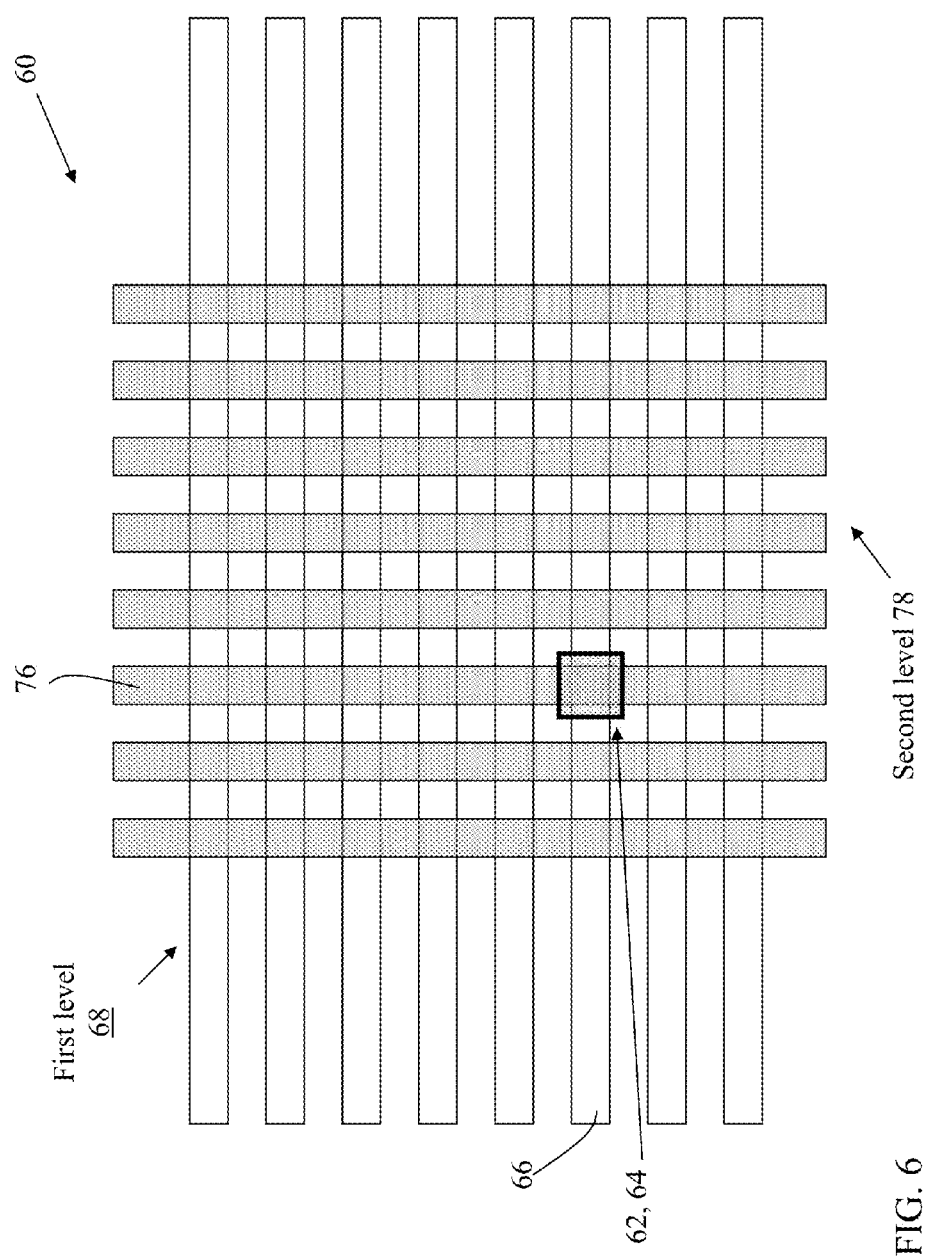
FIGS. 6 and 7 show respective views of multi-level structures which include electrically measurable identifiers according to various embodiments of the invention.
Figure 7:
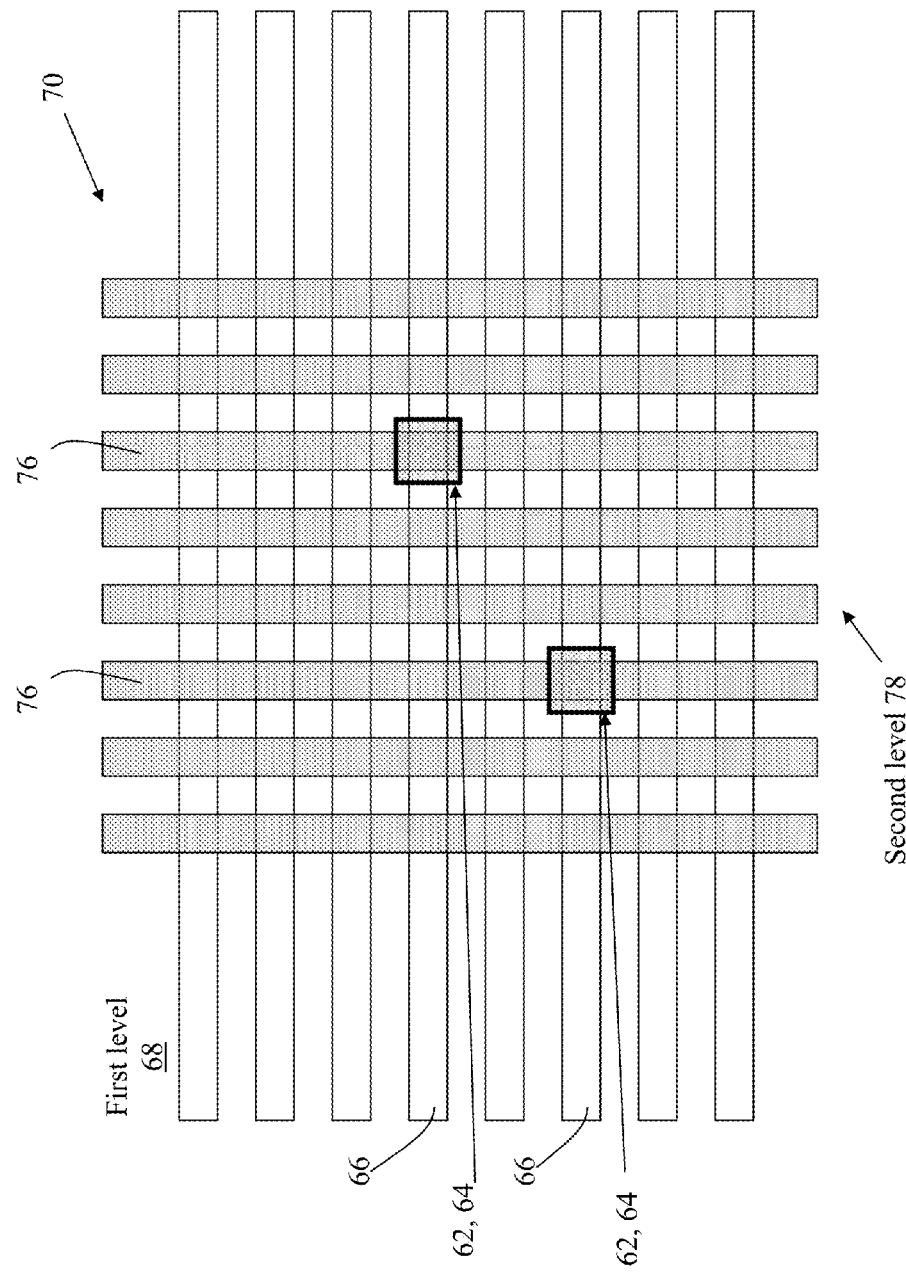

FIGS. 6 and 7 show respective views of alternative multi-level structures 60 and 70, respectively, which include unique (electrically measurable) identifiers 62. More specifically, FIG. 6 shows a single custom via 64 formed connecting a metal line 66 on a first metal level 68, with an overlying (or, higher, or next higher level) metal line 76 on a second metal level 78. The single custom via 64 can include the electrically measurable identifier 62. In this case, as well as in others shown and described herein, the electrically measurable identifier 62 can span a plurality of levels in an IC structure. FIG. 7 shows another embodiment in which a plurality of custom vias 64 are used to connect distinct sets of lines on the first metal level 68 and the second metal level 78. As shown the first custom via 64 connects a first metal line from the first metal level 68 and a first metal line from the second metal level 78; while the second custom via 64 connects a second (distinct) metal line from the first metal level 68 and a second (distinct) metal line from the second metal level 78. It is also understood that the custom via(s) 64 could include multi-level vias, which could span between three or more metal levels, e.g., first metal level 68, second metal level 78 and a third metal level.

Figure 8:
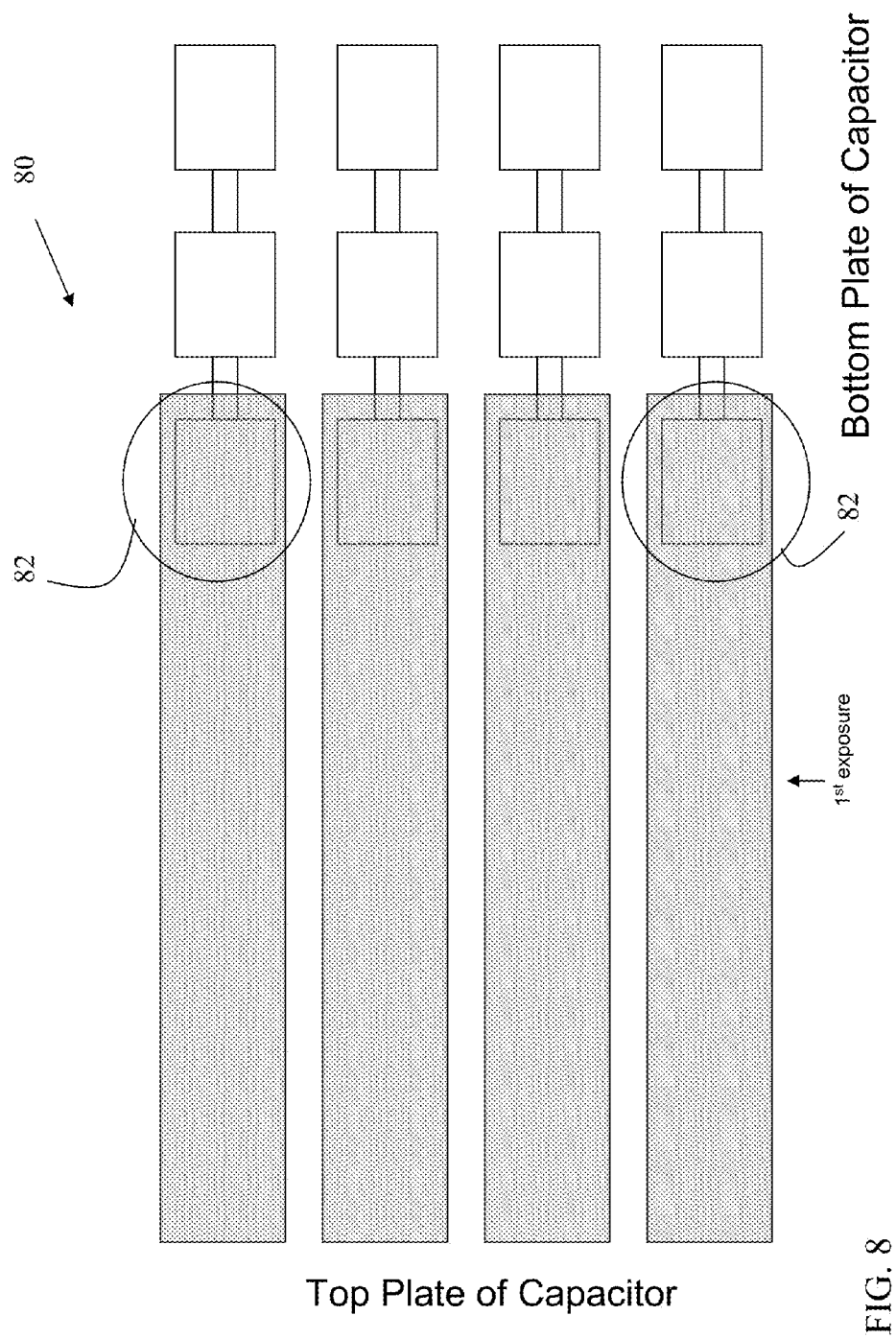
FIGS. 8 and 9 show respective plan views of multi-level capacitor structures according to various embodiments of the invention.
Figure 9:
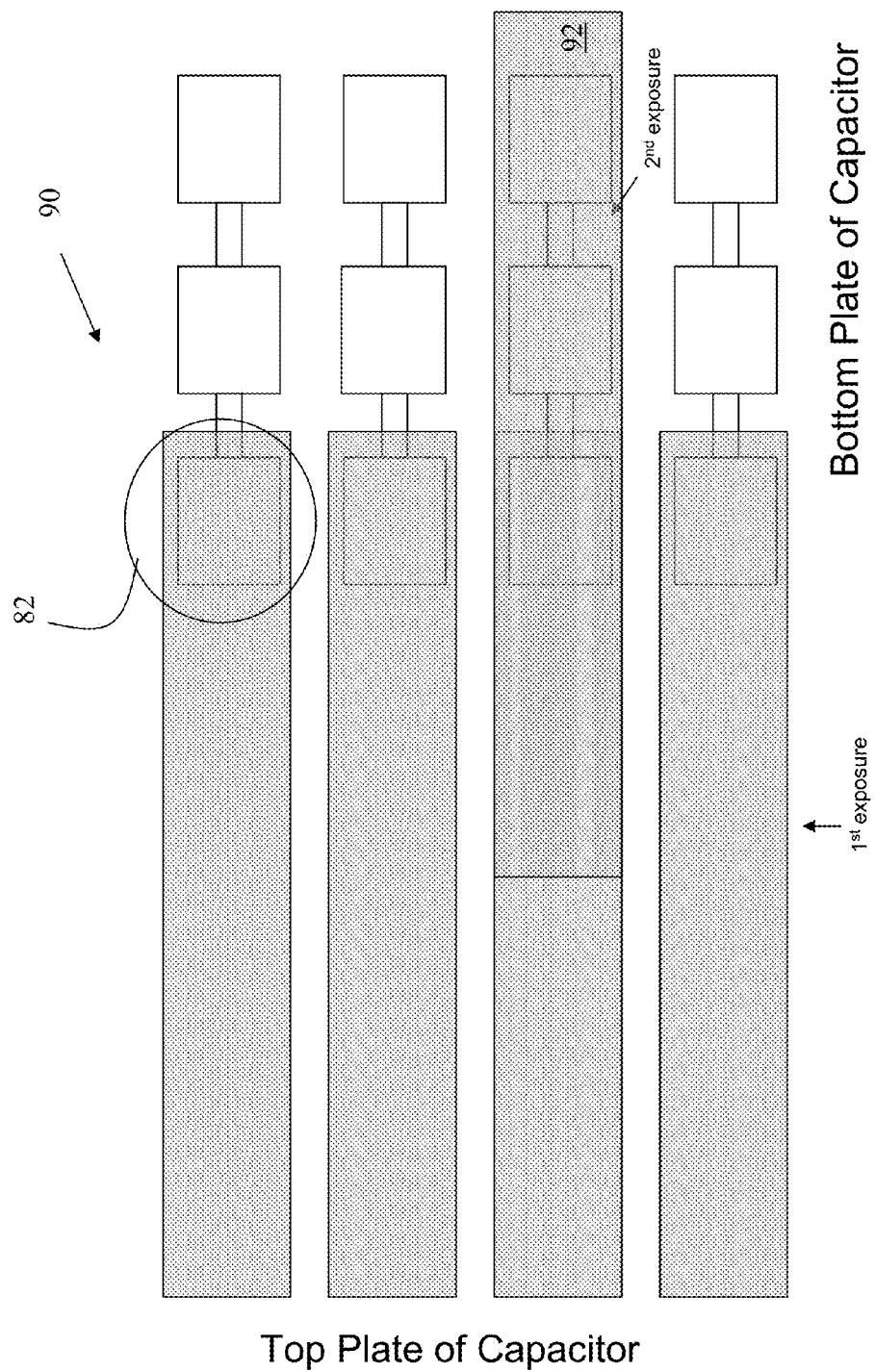

FIGS. 8 and 9 show respective plan views of alternative structures, including multi-level capacitor structures 80 and 90, respectively. As shown, different levels of the capacitor structure 80 can be embedded with a unique, electrically measurable identifier 82. The multi-level capacitor 90 of FIG. 9 includes a second line 92 (from a second exposure) which contacts a distinct section of the bottom plate of the capacitor structure 90.

Figure 10:
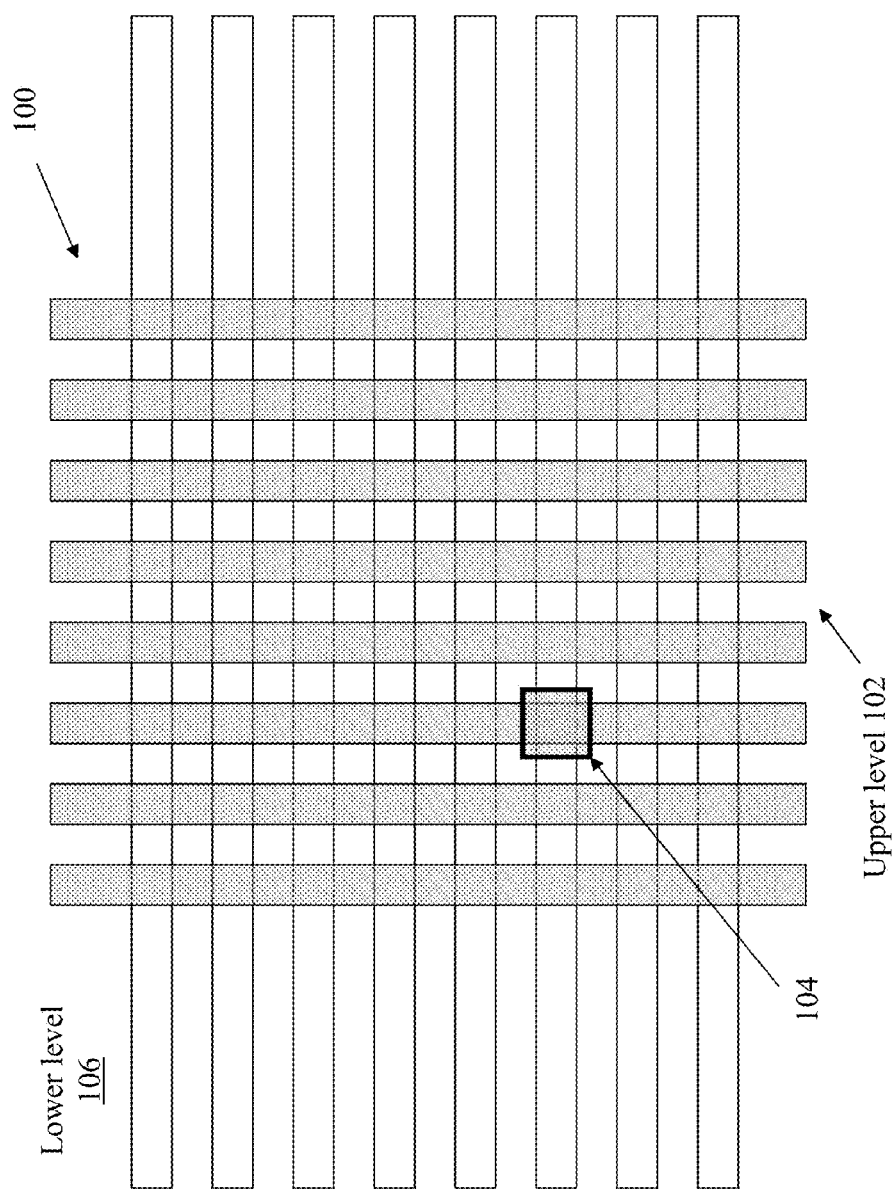
FIG. 10 shows an alternative embodiment of an IC structure according to various embodiments of the invention.
Figures 11A, 11B:
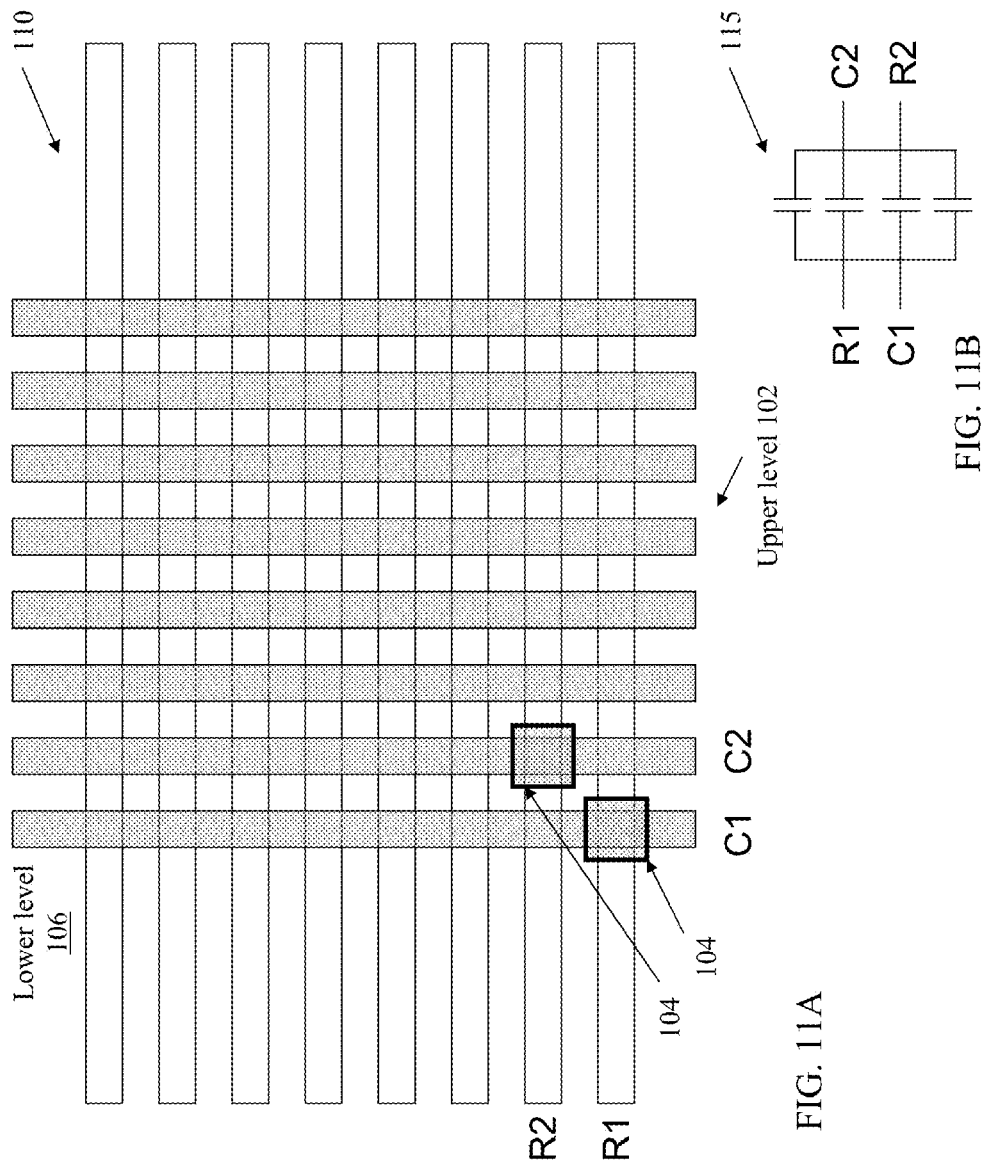
FIG. 11A shows an alternative embodiment of an IC structure according to various embodiments of the invention.
FIG. 11B shows a schematic depiction of a capacitance diagram according to the IC structure of FIG. 11A.

FIGS. 10 and 11A-11B show alternative embodiments of IC structures 100 and 110, respectively. FIG. 10 illustrates double exposure of an upper level metal layer 102, which forms a unique, electrically measureable identifier 104 connecting the upper level metal layer 102 and a lower level metal layer 106. FIG. 11A shows an IC structure 110 having multiple electrically measureable identifiers 104 (vias in this case), where the electrically measureable identifiers 104 can contact distinct upper line levels (C1 and C2, respectively) and distinct lower line levels (R1, R2, respectively). FIG. 11B shows a capacitor diagram 115 illustrating a schematic depiction of the capacitor structure formed by the connection of the electrically measurable identifiers 104.

Figure 12:
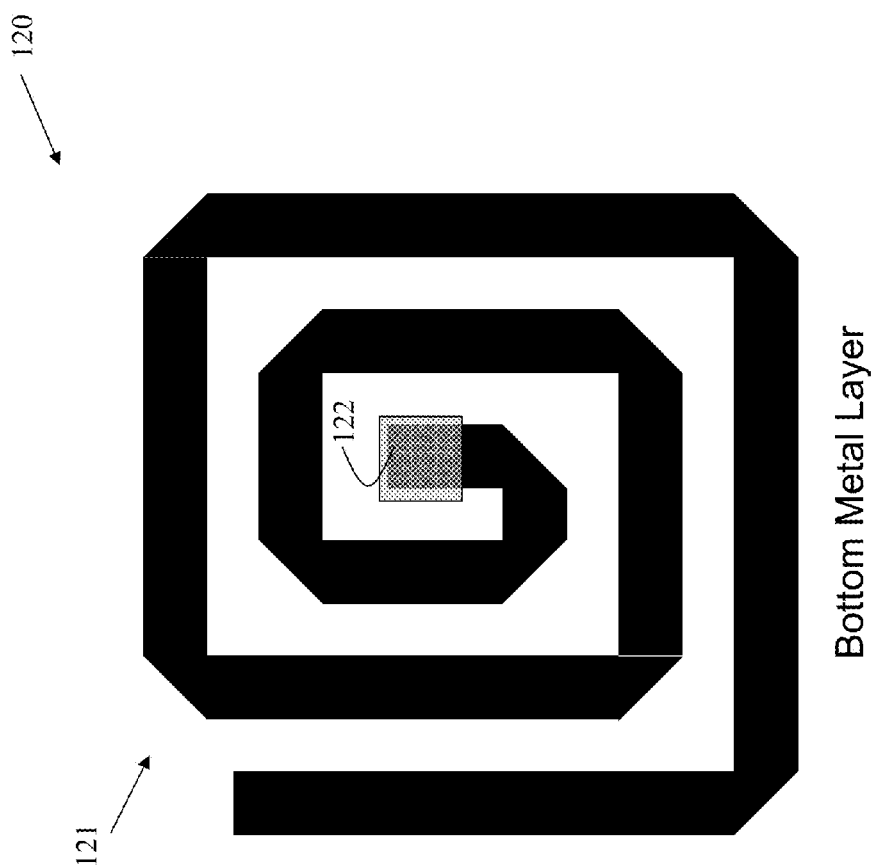
FIGS. 12-14 illustrate respective plan views of inductor structures each including an electrically measurable identifier, according to various embodiments of the invention.
Figure 13:
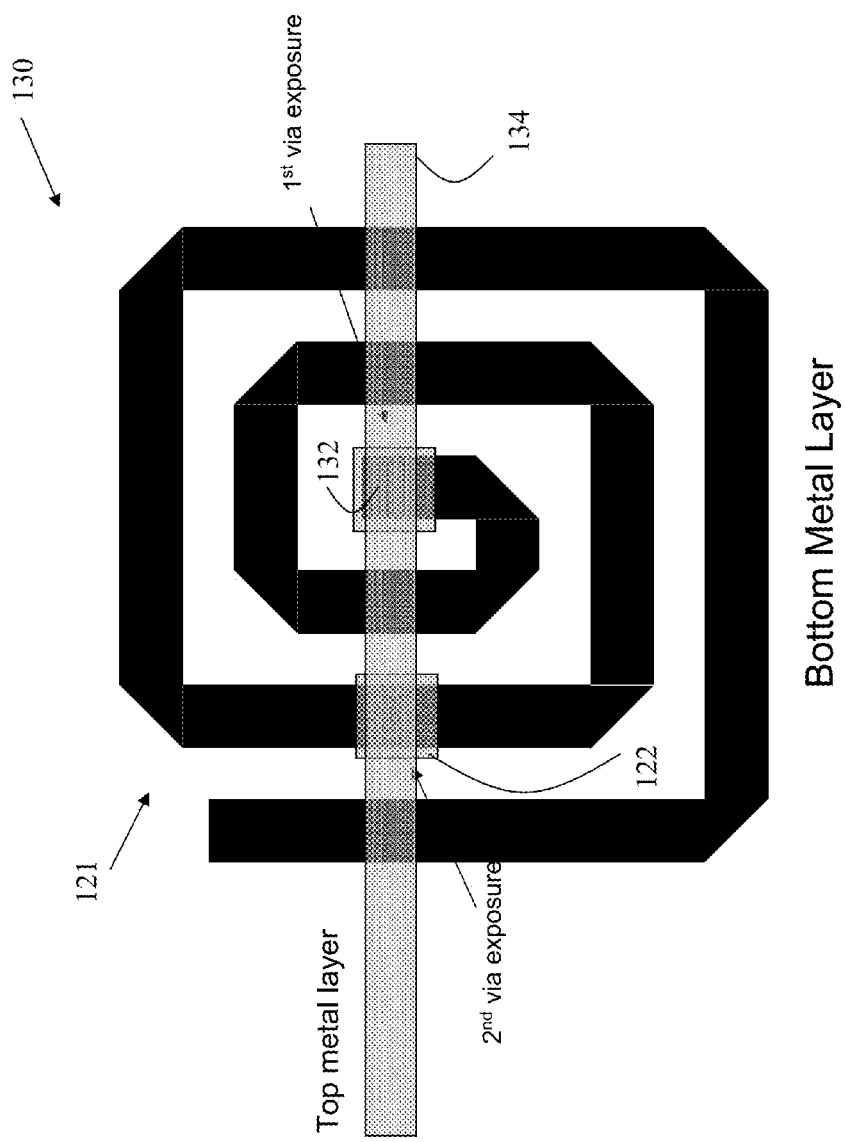
Figure 14:
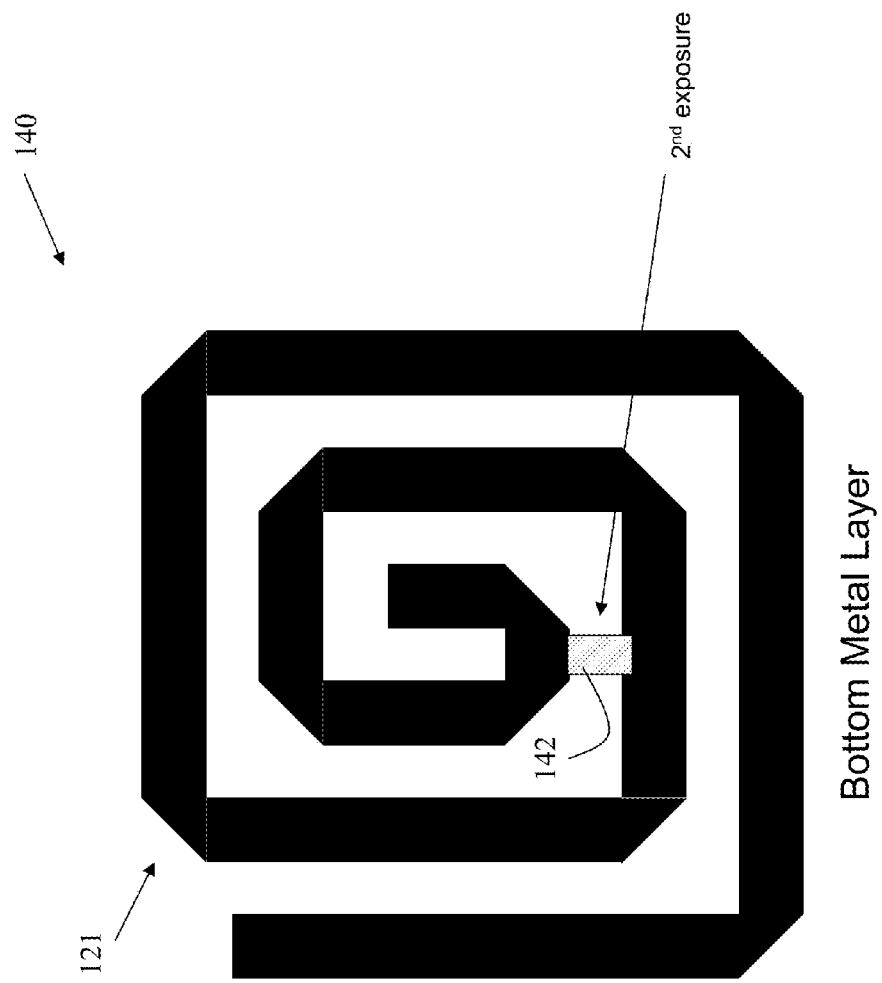

FIGS. 12-14 illustrate respective plan views of inductor structures 120, 130, 140, each including an electrically measurable identifier. FIG. 12 illustrates an inductor 121 having a custom via 122, which acts as an electrically measurable identifier for the inductor structure 120. FIG. 13 illustrates an inductor structure 130 having two custom vias 132, which are connected via an upper level line 134, which can be formed during a second exposure process. The upper level line 134 can connect with each of the custom vias 132, which each contact distinct portions of the underlying inductor 121. FIG. 14 illustrates an inductor structure 140 having a metal shorting structure 142, which connects two distinct portions of the inductor 121 to intentionally create a short. The metal shortening structure 142 can act as an electrically measurable identifier for the inductor structure 140.

Figure 15:
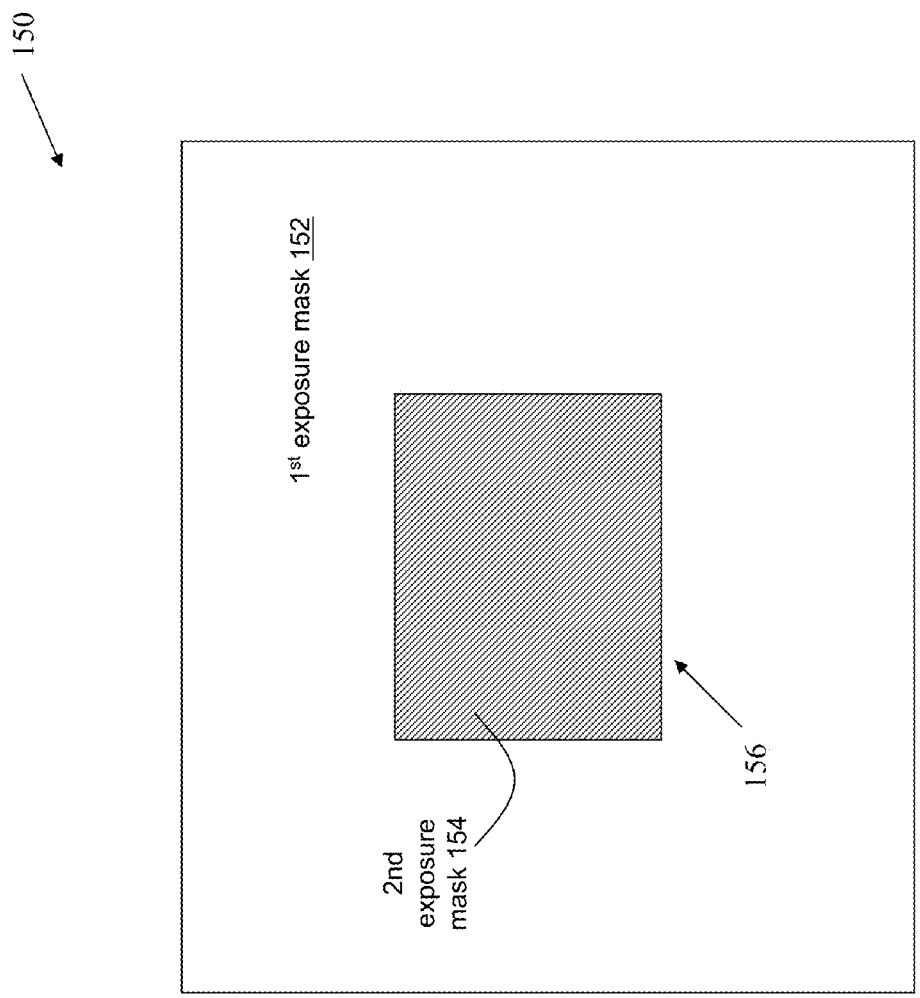
FIG. 15 illustrates a structure where a first exposure process is performed with a first resist polarity, and a second, subsequent exposure process is performed with an opposite resist polarity, according to various embodiments of the invention.

FIG. 15 illustrates a structure 150 where a first exposure process (first exposure mask 152) is performed with a first resist polarity, and a second, subsequent exposure process (second exposure mask 154) is performed with an opposite resist polarity. This process can be used to form a hole 156 in the underlying metal layer undergoing exposure. The hole 156 can take the form of the second exposure mask 154.

Figure 16:
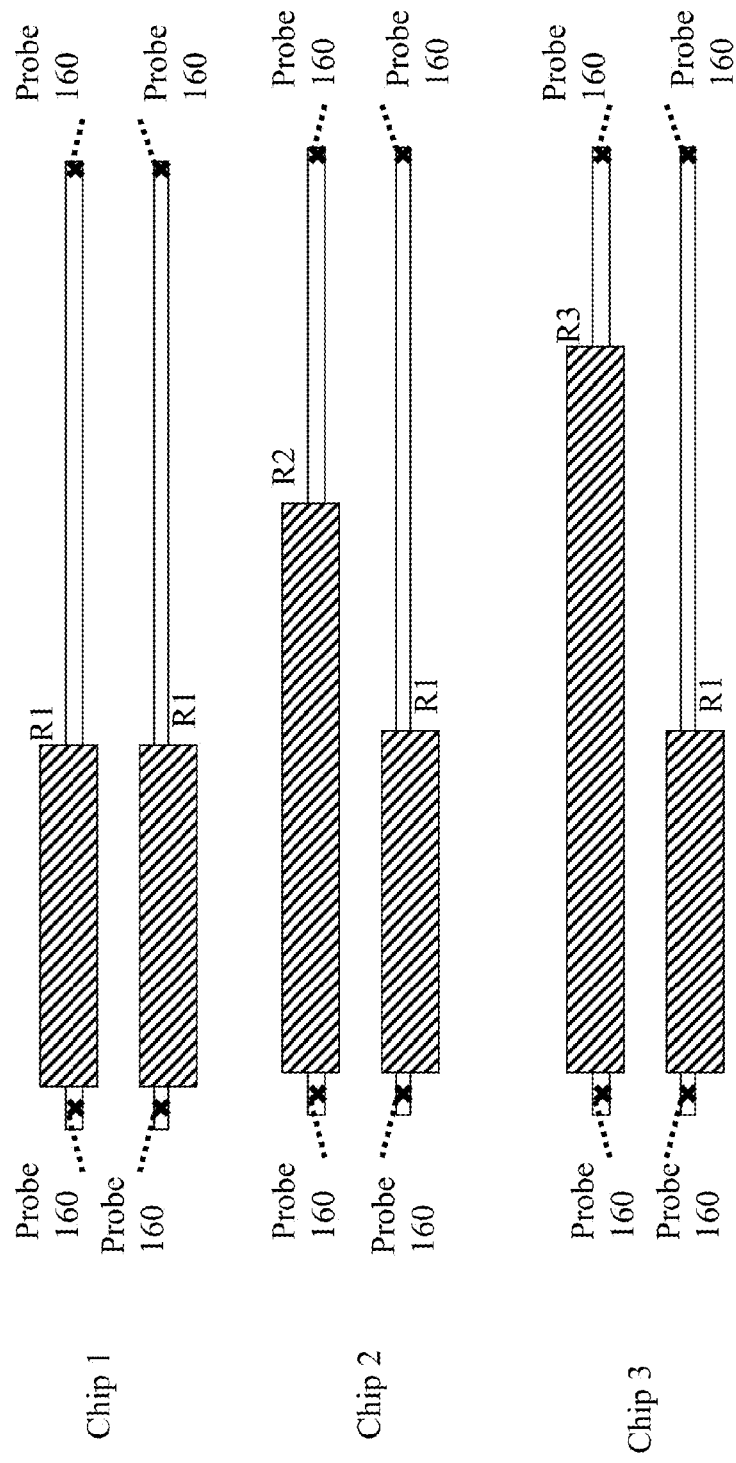
FIG. 16 illustrates resistor structures formed according to various embodiments of the invention.

FIG. 16 shows an example of how exposure processes according to various embodiments can be utilized to form differing resistor lengths. As shown, three distinct chips (Chip 1, Chip 2, Chip 3) include resistors having different length ratios (R1:R1, R2:R1 and R3:R1). These lengths can be varied by different exposure processes, as described herein. It is understood that chips having different resistance length ratios (e.g., Chip 1 v. Chip 2 v. Chip 3) will have different resistances, which can be electrically measured via one or more probe points 160.

Figure 17A:
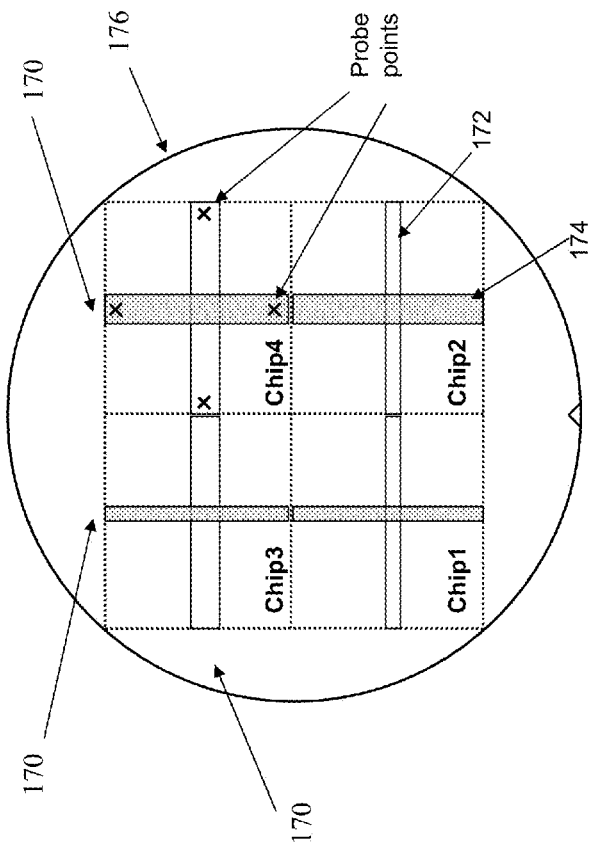
FIG. 17A shows an integrated circuit structure according to various embodiments of the invention.
Figure 17B:
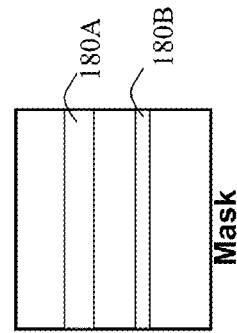
FIG. 17B shows a mask structure used to form the integrated circuit structure of FIG. 17A.

FIG. 17A shows a schematic depiction of an alternative structure in which differing width metal lines 170 are formed at different levels 172, 174 of an IC structure 176. These metal lines 170 can be formed at different widths within the same level (e.g., level 172), and/or between levels 172, 174. As shown in the snap-shot image of FIG. 17B, a mask 178 including openings 180 having a first width 180A and a second width 180B (distinct from the first width 180A) can be used to form the metal lines 170 of FIG. 17A. This mask 178 can be used on different levels (e.g., first level 172 and/or second level 174) of the IC structure 176. This mask 178 (or a similar mask) could be used on multiple printing steps, in multiple orientations. Additionally, this mask 178 could be at least partially shuttered to utilize only portions (e.g., first width 180A line) of the mask 178.

Figure 18:
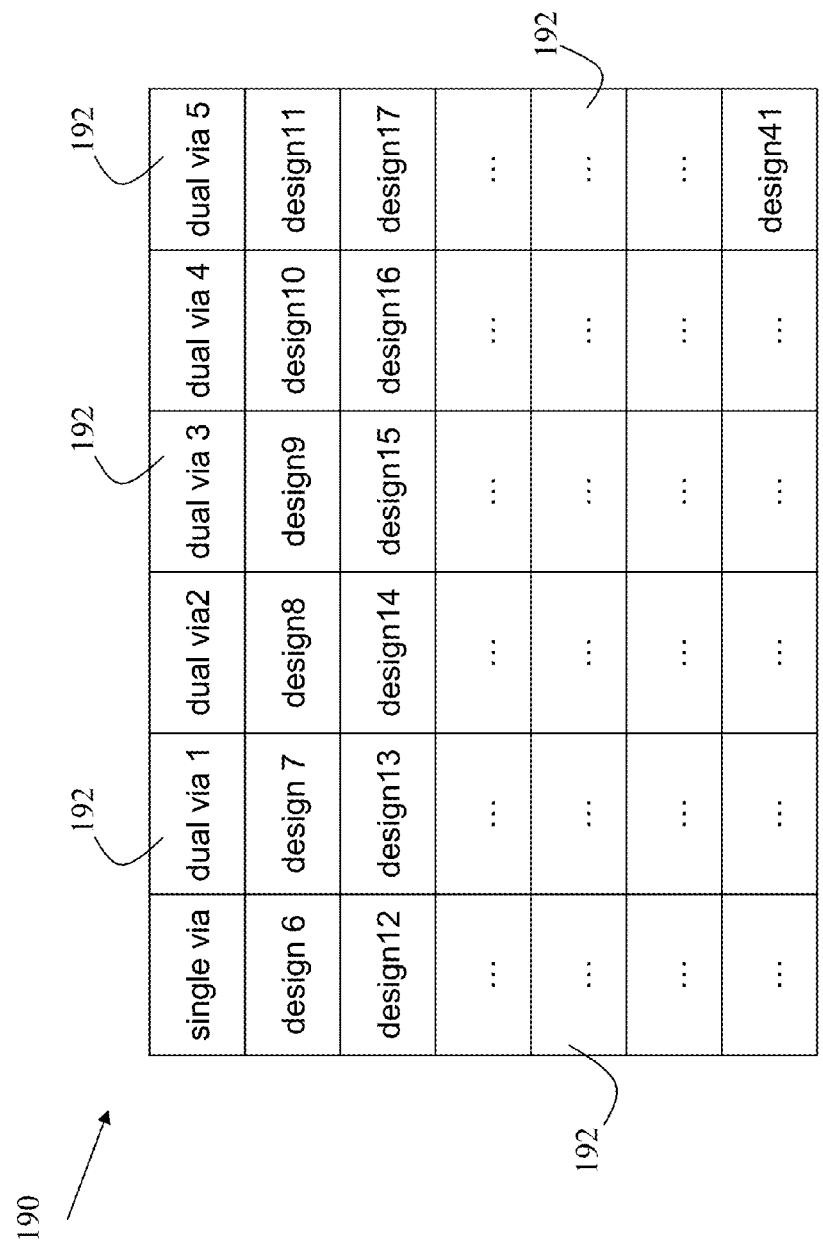
FIG. 18 shows a wafer structure according to various embodiments of the invention.

FIG. 18 illustrates a schematic depiction of a wafer 190 having a plurality of chips 192, where at least two of the plurality of chips 192 are formed using a distinct mask design, yielding distinct electrically measurable indicators. These indicators can include, among others, a single via design, dual via design(s), or other designs.

Figure 19:
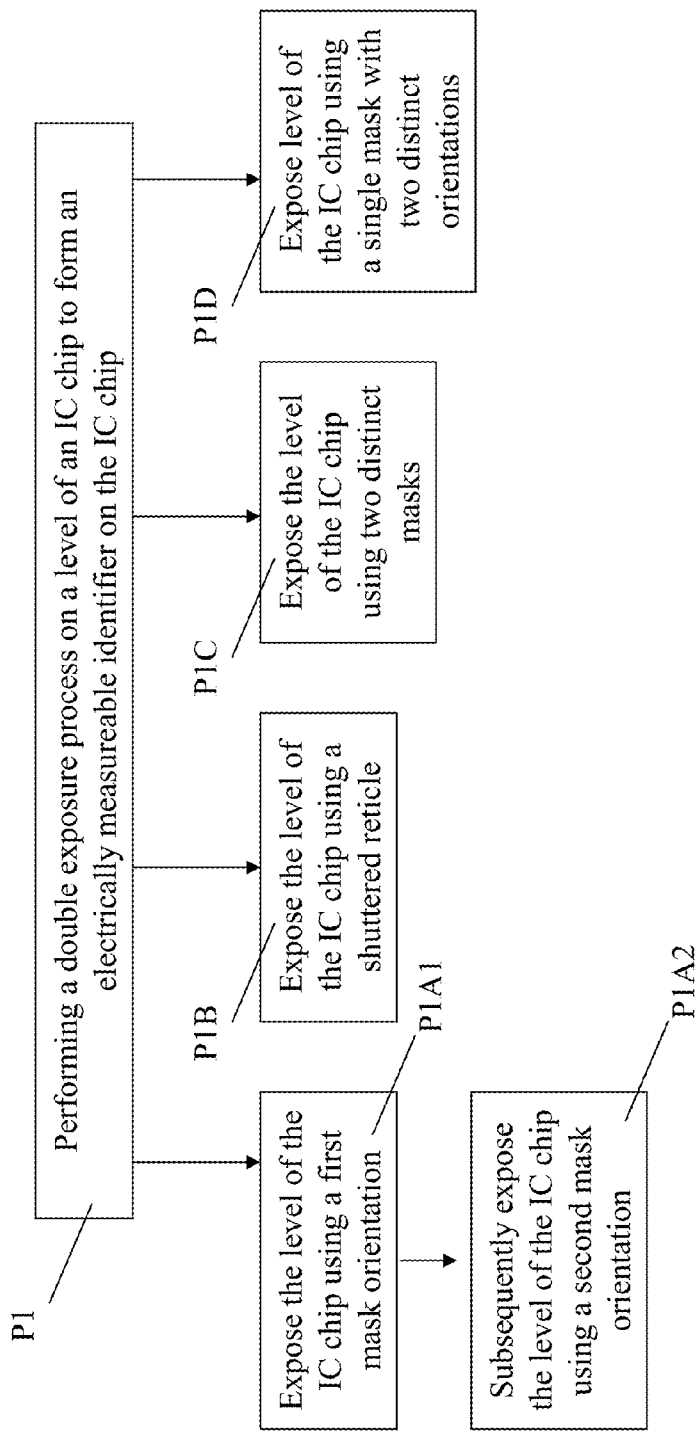
FIG. 19 shows a flow diagram illustrating processes according to various embodiments of the invention.

FIG. 19 is a flow diagram illustrating processes according to various embodiments of the invention. As shown, various methods can include:

Process P1: performing a double exposure process on a level (e.g., a mask level, a polysilicon level, a contact level or an implant level) of an integrated circuit (IC) chip to form an electrically measurable identifier on the IC chip. In some cases, process P1 can include sub-processes, such as:

P1A1: exposing the level of the IC chip using a first mask orientation;

P1A2: subsequently exposing the level of the IC chip using a second mask orientation distinct from the first mask orientation.

In alternative sub-processes, the double exposure process can include:

Process P1B: exposing the level of the IC chip using a shuttered reticle. This can include: exposing the level of the IC chip to a first pattern; moving a shutter to reveal a second pattern on the shuttered reticle; and exposing the level of the IC chip to the second pattern after the exposing of the level of the IC chip to the first pattern.

In even further alternative sub-processes, the double exposure process can include: P1C: exposing the level of the IC chip using two distinct masks.

In even further alternative sub-processes, the double exposure process can include: P1D: exposing the level of the IC chip using a single mask with two distinct orientations.

Figure 20:
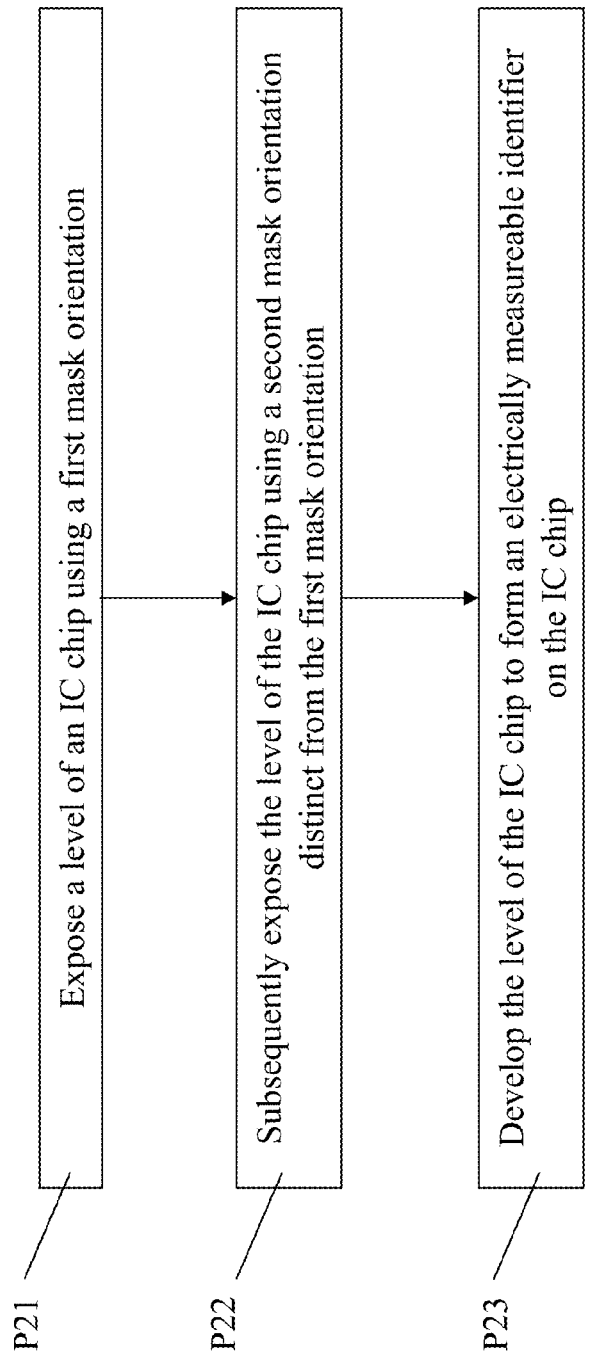
FIG. 20 shows a flow diagram illustrating processes according to various embodiments of the invention.

FIG. 20 is a flow diagram illustrating an alternative process according to various embodiments of the invention. In these cases, the process can include:

Process P21: exposing a level (e.g., a mask level, a polysilicon level, a contact level or an implant level) of an integrated circuit (IC) chip using a first mask orientation. In some embodiments, this process can include exposing the level of the IC chip using a shuttered reticle at a first shuttered position. In various alternative embodiments, this process can include exposing the level of the IC chip using a single mask at a first orientation;

Process P22: subsequently exposing the level of the IC chip using a second mask orientation distinct from the first mask orientation. In some embodiments, this process can include exposing the level of the IC chip using a shuttered reticle at a second shuttered position distinct from the first position. In various alternative embodiments, this process can include exposing the level of the IC chip using the single mask at a second orientation distinct from the first orientation; and Process P23: developing the level of the IC chip to form an electrically measurable identifier on the IC chip. In some cases, the electrically measurable identifier is measurable for at least one of electrical continuity, electrical resistance or electrical capacitance.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

We claim:

1. A method comprising:
   overlaying a first mask, at a first orientation, over a level of an integrated circuit (IC) chip, wherein the level of the IC chip includes a photosensitive material;
   exposing the level of the IC chip, through the first mask, to a light source to form a first pattern in the level of the IC chip;
   overlaying the first mask, at a second orientation distinct from the first orientation, over the level of the IC chip after the exposing to form the first pattern;
   subsequently exposing the level of the IC chip, through the first mask at the second orientation distinct from the first orientation, to a light source to form a second pattern in the level of the IC chip,
   wherein the photosensitive material of the level of the IC chip is exposed during the exposing, and wherein the photosensitive material of the level of the IC chip is exposed during the subsequent exposing; and
   filling the first pattern and the second pattern with a conductive material to form an electrically measurable identifier on the IC chip.

2. The method of claim 1, wherein the level is a mask level of the IC chip.

3. The method of claim 1, wherein the level is one of a polysilicon level, a contact level, or an implant level of the IC chip.

4. The method of claim 1, wherein the exposing of the level of the IC chip using the first mask orientation includes exposing the level of the IC chip using a shuttered reticle at a first shuttered position.

5. The method of claim 4, wherein the exposing of the level of the IC chip using the second mask orientation includes exposing the level of the IC chip using a shuttered reticle at a second shuttered position distinct from the first position.

6. The method of claim 1, wherein the electrically measurable identifier is measurable for at least one of electrical continuity, electrical resistance or electrical capacitance.

7. A method comprising:
   overlaying a first mask on a first level of an integrated circuit (IC) chip, to form a first pattern;
   overlaying a second mask on the first level of the IC chip, to form a second pattern, wherein the second pattern connects a single line from the first pattern with a single line from the second pattern, forming a connecting mask structure having an L-shape;
   exposing the IC chip at the first level, through the first mask and the second mask, to a light source to form a designated pattern in the first level of the IC chip, wherein the first level of the IC chip includes a photosensitive material which is exposed during the exposing,
   wherein the first mask includes a plurality of mask shapes, and the second mask includes a plurality of mask shapes perpendicularly aligned with the plurality mask shapes in the first mask, and wherein the L-shaped connecting mask structure connects one of the plurality of mask shapes in the first mask and one of the plurality of mask shapes in the second mask; and
   filling the designated pattern in the photosensitive material of the first level of the IC chip with a conductive material to form an electrically measurable identifier on the IC chip.

8. A method of forming an integrated circuit (IC) structure having a plurality of electrically measurable identifiers, the method comprising:
   overlaying a first mask, at a first orientation, over a level of the IC structure, wherein the level of the IC structure includes a photosensitive material and contacting plurality of distinct lower level lines;
   exposing the level of the IC structure, through the first mask, to a light source to form a first pattern in the level of the IC structure;
   overlaying the first mask, at a second orientation distinct from the first orientation, over the level of the IC structure after the exposing to form the first pattern including a first via opening over a first one of the plurality of distinct lower level lines in the IC structure;
   subsequently exposing the level of the IC structure, through the first mask at the second orientation distinct from the first orientation, to a light source to form a second pattern including a second via opening over a second one of the plurality of distinct lower level lines in the IC structure,
   wherein the photosensitive material of the level of the IC structure is exposed during the exposing, and wherein the photosensitive material of the level of the IC structure is exposed during the subsequent exposing;
   filling the first pattern and the second pattern with a conductive material to form the plurality of electrically measurable identifiers on the IC structure, the plurality of electrically measurable identifiers including a first via corresponding with the first via opening and a second via corresponding with the second via opening; and
   depositing a conductive material over the level of the IC structure to form a plurality of distinct upper level lines, wherein the first via contacts the first one of the plurality of lower level lines and a first one of the plurality of distinct upper level lines, and wherein the second via contacts the second one of the plurality of lower level lines and a second one of the plurality of distinct upper level lines, wherein the second upper level line is distinct from the first upper level line.

* * * * *